United States Patent [19]

Gunji et al.

[11] Patent Number: 5,781,082
[45] Date of Patent: Jul. 14, 1998

[54] POWER SUPPLY FILTER FOR PREVENTING NOISE SIGNAL FROM ENTERING POWER SUPPLY CIRCUIT

[75] Inventors: Yoshihide Gunji; Hideaki Matsuzaki; Hiroshi Ohsawa, all of Ohsato-gun, Japan

[73] Assignee: Zexel Corporation, Tokyo, Japan

[21] Appl. No.: 521,441

[22] Filed: Aug. 30, 1995

[30] Foreign Application Priority Data

Sep. 14, 1994 [JP] Japan ................................. 6-244851

[51] Int. Cl.$^6$ .............................................. H03H 7/06
[52] U.S. Cl. ........................ 333/172; 333/185; 361/766
[58] Field of Search .................................. 333/172, 181, 333/185; 361/738, 763, 766, 782, 811

[56] References Cited

U.S. PATENT DOCUMENTS

| | | | |
|---|---|---|---|
| 3,257,631 | 6/1966 | Evans | 333/172 |
| 4,300,115 | 11/1981 | Ansell et al. | 338/314 |
| 4,772,862 | 9/1988 | Kubo et al. | 333/185 X |
| 4,937,719 | 6/1990 | Yamada et al. | 333/181 X |
| 5,015,975 | 5/1991 | Okubo | 333/185 X |
| 5,023,578 | 6/1991 | Kaneko et al. | 333/185 |
| 5,119,272 | 6/1992 | Ohyama et al. | 361/782 X |
| 5,376,866 | 12/1994 | Erdmann | 318/254 |

FOREIGN PATENT DOCUMENTS

| 318110 | 1/1991 | Japan | 333/185 |
|---|---|---|---|

OTHER PUBLICATIONS

Graf, *Modern Dictionary of Electronics,* pp. 377, 856, 857, 1988.

Halliday/Resnick, *Fundamentals of Physics,* 1981, pp. 506–507.

*Primary Examiner*—Robert Pascal
*Assistant Examiner*—Justin P. Bettendorf
*Attorney, Agent, or Firm*—Pollock, Vande Sande & Priddy

[57] ABSTRACT

In an R-C filter for preventing a noise signal from entering a power supply system through its output circuit, a circuit component acting as a resistive element for the filter is connected in series with the output circuit and a capacitive element is connected between one portion of the circuit component and ground to form an R-C type filter. A wiring member, a printed wiring foil, a through-hole member, a semiconductor device or other such circuit component can be used, as the circuit component acting as the resistive element for constituting the R-C type filter.

20 Claims, 4 Drawing Sheets

6,781,082

POWER SUPPLY FILTER FOR PREVENTING NOISE SIGNAL FROM ENTERING POWER SUPPLY CIRCUIT

FIELD OF THE INVENTION

The present invention relates to a power supply filter which is capable of preventing noise signals generated in various portions of a load circuit powered by a power supply from entering the power supply circuit or system from its output side.

BACKGROUND OF THE INVENTION

A circuit for switching a current of relatively high level, such as a driving control circuit for a d.c. brushless motor, is liable to produce high-level noise signals which cause various interference actions in other circuits into which the noise signals enter through a common power supply circuit. In the prior art, in order to avoid the foregoing disadvantage, a low-pass filter constituted by the use of a coil and a capacitor is provide as a power supply filter between the noise source circuit and the power supply system to prevent the noise signals from entering the power supply system.

However, in the case where the power supply filter is constituted by the use of one or more coils and capacitors; the magnetic saturation characteristics of the filter require that the size of the power supply filter be increased as the rated current becomes greater. Accordingly, it is difficult to keep the power supply filter small in size. Although constituting the circuit of the filter using a resistor element instead of a coil element is helpful in overcoming this disadvantage, a resistor of large size is required for the circuit configuration in view of the large voltage drop and the rated power consumption. As a result, the size of the power supply filter becomes greater even if a resistor element is employed instead of a coil element.

SUMMARY OF THE INVENTION

It is an object of the present invention to provide a power supply filter for preventing noise signals from entering a power supply circuit, which requires no coil element and can be compactly fabricated.

It is another object of the present invention to provide a small size filter for a power supply circuit, which has a resistance-capacitance type configuration and is capable of suppressing the level of noise signals.

It is a further object of the present invention to provide a small size filter of resistance-capacitance type, which is configured to make circuit components serve a double purpose.

It is a still further object of the present invention to provide a power supply filter for preventing noise signals produced by a brushless motor driving circuit from entering its power supply system.

According to the present invention, in a power supply filter of resistance-capacitance type for preventing a high frequency noise signal from entering a power supply system through the output circuit of the power supply system, a circuit component acting as a resistive element is connected in series with the output circuit and a capacitive element is connected between one terminal of the circuit component and ground. Furthermore, another capacitive element may be connected between the other terminal of the circuit component and ground. In this type of filter the required resistance value of the circuit component used as the resistive element is, for example, 2 to 5 milli-ohms. Accordingly, a part of the printed wiring of a printed circuit board can be used as the circuit component.

In one embodiment of the present invention, the resistance value of one or more through-holes is utilized, and the magnitude of the resistance value of the through-hole(s) is adjusted by changing the through-hole diameter and /or the number of through-holes. Alternatively, various wiring materials used as circuit components can also be used as the resistive element. In the case where a part of the printed wiring is used as the circuit component serving as the resistive element, the resistance value thereof may be adjusted to a desired value by adjusting the thickness and width of the wiring, that is, its cross-sectional area and length.

The resistive portion of a semiconductor device, such as a field effect transistor being in its conductive state, can also be utilized as the resistive element for the power supply filter. That is, if the current control circuit of a semiconductor device, such as the drain-source circuit of a field effect transistor, is connected in series with the output circuit of the power supply system and the semiconductor device is turned on by the application of a prescribed bias voltage to its gate electrode, the current control circuit in its conductive state can be used as the resistive element for the filter circuit.

A power supply filter of π type, L type or other such circuit configuration can be constituted using only one resistive element selected from among the foregoing various types of circuit components. However, it is also possible to constitute a multistage R-C type filter in which a plurality of circuit components are connected in tandem and at least one capacitor is connected between at least one connection point of the circuit components and ground.

In the case where a semiconductor device such as a field effect transistor is utilized as the circuit component, the semiconductor device in its conductive state may be used as the resistive element for the filter between a brushless motor driving circuit and its power supply circuit to prevent high-frequency noise signals generated in the brushless motor driving circuit from entering the power supply circuit. This circuit configuration can conduct a load current of approximately 30 amperes. At the same time, it is possible to use the semiconductor device to protect the brushless motor driving circuit from being applied with a source voltage of reverse polarity.

Since, as described above, a circuit component having relatively small resistance value, such a part of the printed wiring of a printed circuit board, a through-hole, a wire, a conducting portion of a semiconductor device such as a field effect transistor or the like, is utilized as the resistive element of the power supply filter, the power supply filter can be of small size.

BRIEF DESCRIPTION OF THE DRAWINGS

The invention will be better understood and other objects and advantages thereof will be more apparent from the following detailed description of preferred embodiments with reference to the drawings in which.

DETAILED DESCRIPTION OF THE PREFERRED EMBODIMENTS

Figure 1:
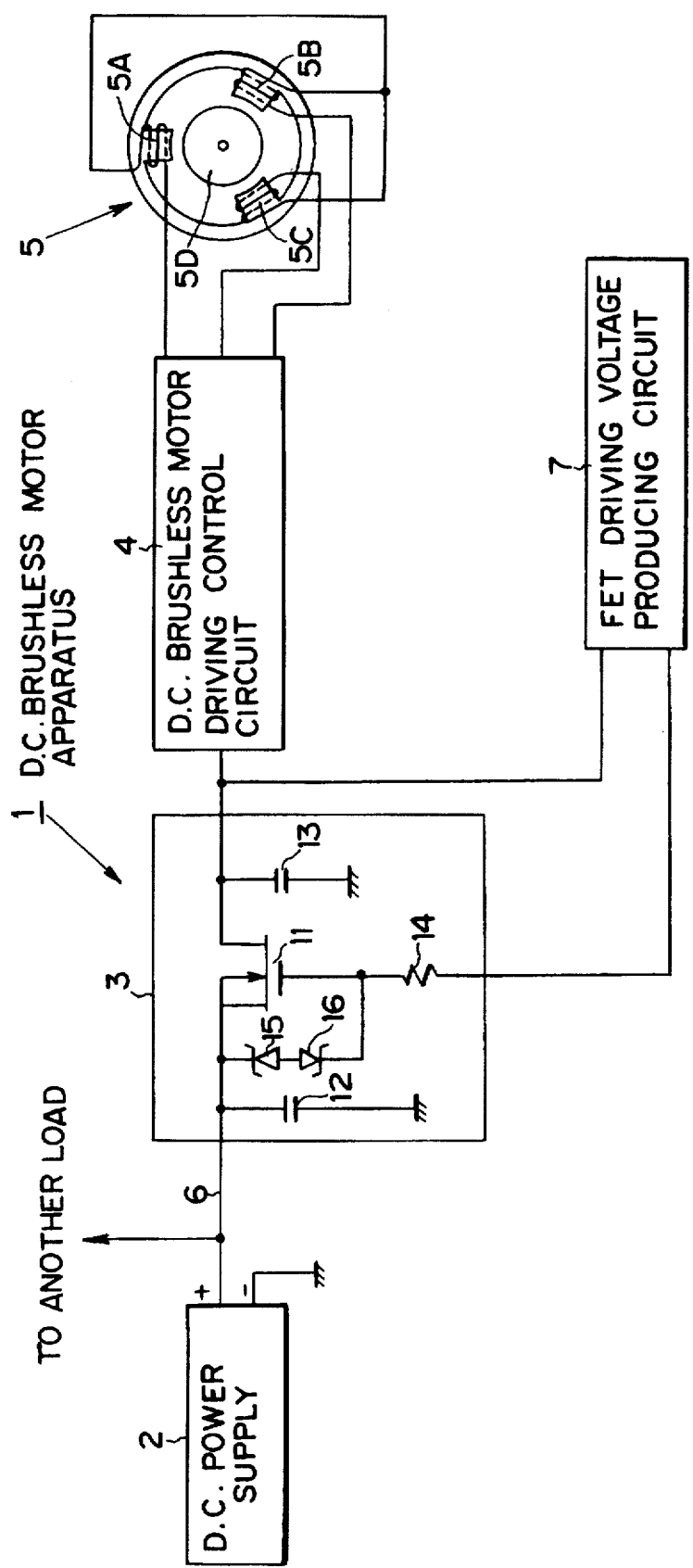
FIG. 1 is a circuit diagram showing a direct current brushless motor apparatus with a power supply filter which is an embodiment of the present invention.

FIG. 1 illustrates an embodiment of a power supply filter according to the present invention, which is applied to a direct current brushless motor apparatus 1. The d.c. brushless motor apparatus 1 has a d.c. power supply 2 from which a direct current voltage is supplied through a power supply filter 3 constituted in accordance with the present invention to a d.c. brushless motor driving control circuit 4. The d.c. brushless motor driving control circuit 4, which is of well-known design, supplies a relatively large exciting current of, e.g., some ten amperes to the exciting coils 5A, 5B and 5C of the respective phases of a d.c. brushless motor 5 with the required phase differences so as to produce a rotating magnetic field, whereby a rotor 5D of the d.c. brushless motor 5 rotates.

The power supply filter 3 is provided for preventing the high-frequency noise signal produced by switching operation in the d.c. brushless motor driving control circuit 4 from entering the d.c. power supply 2 via an output circuit 6 of the d.c. power supply 2, or for reducing the level of the high-frequency noise signal entering the d.c. power supply 2 via the output circuit 6 of the d.c. power supply 2.

The power supply filter 3 will now be described. The power supply filter 3 has a field effect transistor (FET) 11 in the path of the output circuit 6 for connecting the d.c. power supply 2 and the d.c. brushless motor driving control circuit 4. The drain-source circuit of the FET 11 is connected in series with the output circuit 6 in the polarity shown in FIG. 1. The source electrode of the FET 11 is grounded through a first capacitor 12 and the drain electrode of the FET 11 is grounded through a second capacitor 13. The gate electrode of the FET 11 is connected through a bias resistor 14 with one output terminal of an FET driving voltage producing circuit 7 having another output terminal connected with the drain electrode of the FET 11. Zener diodes 15 and 16 are connected between the source and gate electrode of the FET 11 in the polarity shown in FIG. 1.

Consequently, when a prescribed d.c. voltage from the d.c. power supply 2 is impressed on the source electrode of the FET 11 in the correct polarity, a current is supplied through a parasitic diode formed in the FET 11 to the FET driving voltage producing circuit 7, whereby a voltage sufficient for making the FET 11 conductive is applied to the gate electrode. As a result, the required direct current can be supplied through the FET 11 from the d.c. power source 2 to the d.c. brushless motor driving control circuit 4. On the other hand, when the d.c. output voltage from the d.c. power supply 2 is applied to the power supply filter 3 in the opposite polarity to that shown in FIG. 1, the FET 11 prevents direct current from flowing in the opposite direction. Consequently, no direct current flows in the reverse direction between the d.c. power supply 2 and the d.c. brushless motor driving control circuit 4 even if the d.c. power supply 2 is connected with the d.c. brushless motor driving control circuit 4 in the wrong polarity. The d.c. brushless motor driving control circuit 4 is therefore protected from being destroyed by a current flowing in the reverse-direction. In other words, in the embodiment shown in FIG. 1 the power supply filter 3 is constituted by the use of a semiconductor device which is a well-known circuit for protecting a circuit from reverse current caused by erroneous connection of the power supply. In addition, the circuit of the filter 3 shown in FIG. 1 can be constituted using a P-channel FET instead of the N-channel FET 11 if the peripheral circuitry is changed accordingly.

The power supply filter 3 shown in FIG. 1 is mainly composed of the FET 11, the first capacitor 12 and the second capacitor 13 arranged to form a π type filter circuit for rejecting high-frequency signal components. In this case the circuit component acting as the resistive element for the filter 3 is the resistive component appearing between the source electrode and the drain electrode when the FET 11 is in its conductive state. The value of the resistive component is on the milli-ohm order. It was confirmed that when the first and second capacitors 12 and 13 each has a capacitance of approximately 820 μF, the power supply filter 3 prevents approximately half of the switching noise generated on the side of the d.c. brushless motor driving control circuit 4 from reaching the side of the d.c. power source 2.

In the foregoing embodiment the power supply filter 3 is constituted as a π type R-C filter using the resistive component of the FET 11, which is a circuit component for protecting the load circuit from being destroyed by erroneous connection of the power supply. With this constitution, in the case where an additional load circuit is connected with the d.c. power supply 2, the noise signals generated in the d.c. brushless motor driving control circuit 4 are effectively prevented from affecting the added load circuit.

The constitution of the power supply filter according to the present invention is not limited only to that of the embodiment shown in FIG. 1. For example, a semiconductor device used for another purpose or a semiconductor device used only for constituting the power supply filter is also usable in place of the FET 11 to form an R-C type power supply filter similar to the filter 3 by the use of the semiconductor device and the capacitors.

Figure 2A:
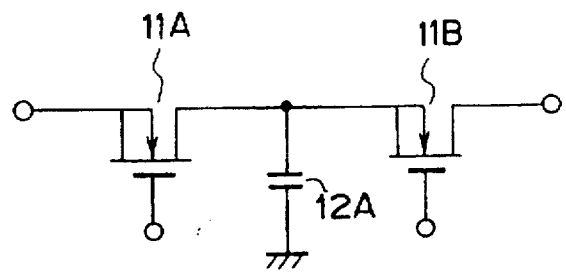
FIGS. 2A to 2C are circuit diagrams illustrating other configurations of the power supply filter according to the present invention.
Figure 2B:
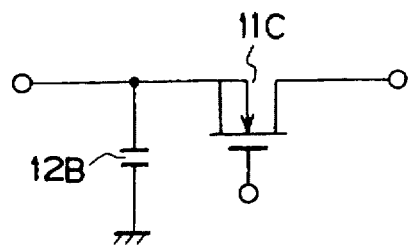
Figure 2C:
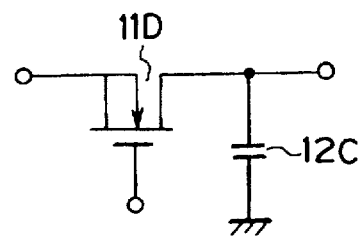

FIGS. 2A to 2c show various modifications of the power supply filter 3 shown in FIG. 1. FIG. 2A is a circuit diagram of a T type (resistance-capacitance-resistance connecting type) R-C power supply filter composed of the respective conducting state portions of semiconductor devices 11A and 11B and a capacitor 12A. FIG. 2B is a circuit diagram of an L type (capacitance-resistance connecting type) R-C power supply filter composed of the conducting state portion of a semiconductor device 11C and a capacitor 12B. FIG. 2C is a circuit diagram of another L type (resistance-capacitance connecting type) R-C power supply filter utilizing the conducting state portion of a semiconductor device 11D and a capacitor 12C.

Figure 3:
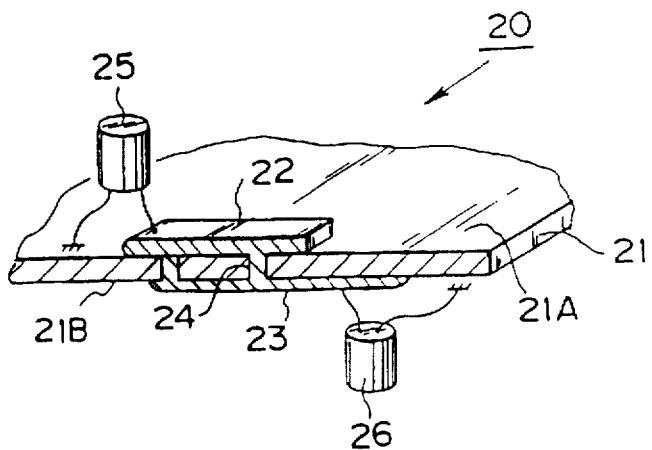
FIG. 3 is a partially cutaway perspective view showing another embodiment of the power supply filter according to the present invention.

FIG. 3 is another embodiment of the power supply filter of the present invention, which is constituted as a resistance-capacitance type filter by utilizing the resistance of a through-hole formed on a printed circuit board. A power supply filter 20 is arranged as a π type R-C power supply filter utilizing the resistance (value) of a through-hole 24 for connecting a wiring conductive foil 22 formed on one surface 21A of a printed circuit board 21 with another wiring conductive foil 23 formed on another surface 21B thereof. The wiring conductive foil 22 is grounded through a capacitor 25 and the wiring conductive foil 23 is grounded through a capacitor 26 to from a π type R-C power supply filter utilizing the resistance of the through-hole 24.

In the foregoing constitution, the through-hole 24 is used as the resistance element for constituting the filter and the diameter of the through-hole 24 is appropriately determined for adjusting the resistance of the through-hole 24 to a value suitable for the resistive element of the R-C filter. This adjustment can be easily conducted at low cost. The through-hole permits the necessary electric energy to flow from the power supply to the load, and the noise signal from the side of the load is effectively suppressed by the filter. That is, a small size R-C power supply filter can be obtained without increasing cost.

Figure 4:
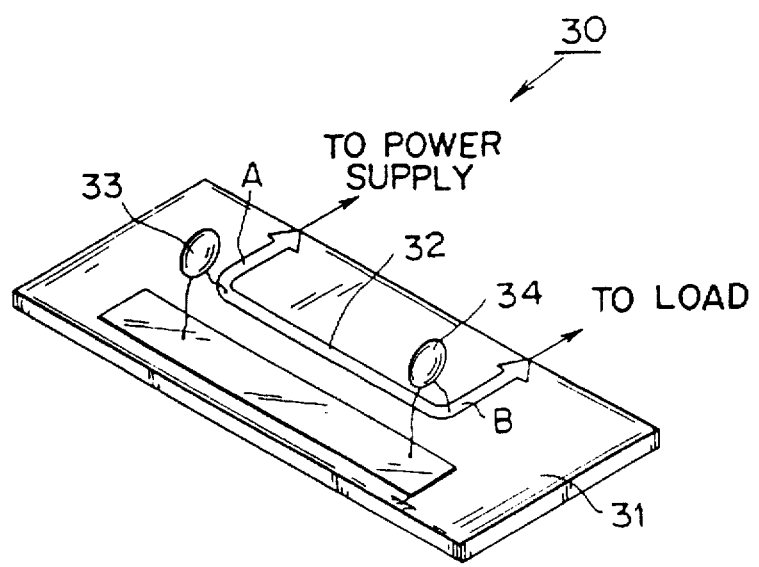
FIG. 4 is a perspective view of a further embodiment of the power supply filter according to the present invention.

FIG. 4 illustrates a further embodiment of the power supply filter of the present invention, which is constituted as a capacitance-resistance-capacitance type filter by utilizing the resistance of a conductive foil for printed wiring formed on the printed circuit board. A power supply filter 30 is constituted by utilizing a part of wiring conductive foil 32 formed on a printed circuit 31 as a resistive element of a R-C filter, and points A and B of the wiring conductive foil 32 are grounded through capacitors 33 and 34, respectively, to form π type R-C power supply filter. The point A of the wiring conductive foil 32 is connected with the power source and the point B is connected with the load.

In order to adjust the resistance of the portion between the points A and B of the wiring conductive foil 32 to the required value, the width, thickness and/or length of the portion between the points A and B of the wiring conductive foil 32 can be appropriately adjusted. That is, the length and cross-sectional area thereof can be determined in such a way that the resistance value of the portion between the points A and B is set to the value required for achieving the desired filtering function.

Figure 5:
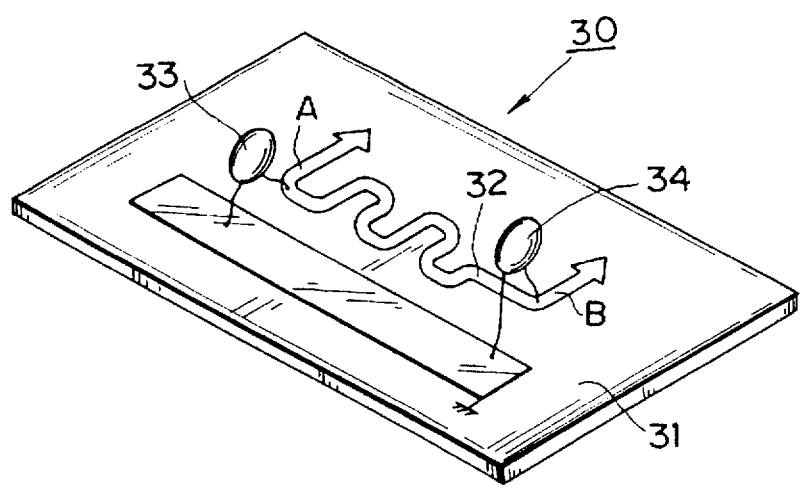
FIG. 5 is a perspective view illustrating a modification of the power supply filter shown in FIG. 4.

When, in the case of FIG. 4, the wiring conductive foil 32 has to have a relatively large cross-sectional area for maintaining the required current capacity, the length of the portion between the point A and B has to be made long to obtain the necessary resistance value. It is therefore preferable to arrange the wiring conductive foil 32 in a zigzag pattern as illustrated in FIG. 5 to obtain the length necessary for obtaining the desired resistance value.

Figure 6:
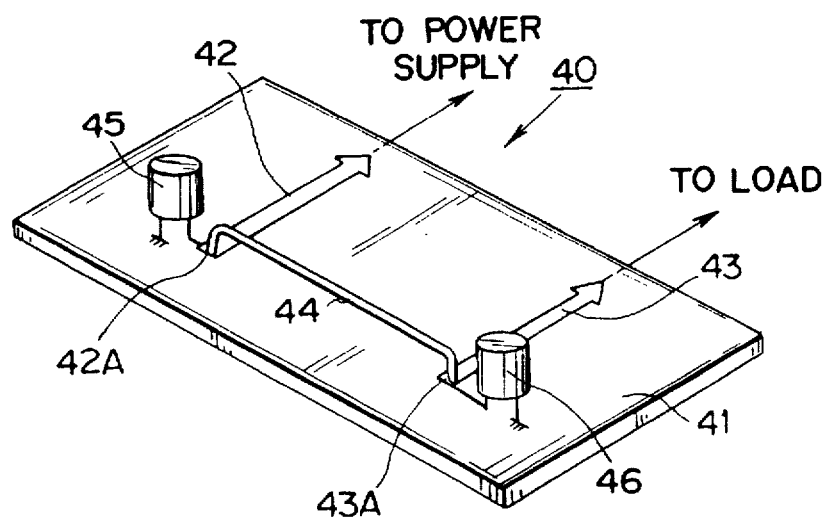
FIG. 6 is a perspective view showing still another embodiment of the power supply filter according to the present invention.

FIG. 6 illustrates a still further embodiment of the power supply filter of the present invention. A power supply filter 40 shown in FIG. 6 is constituted as a π type R-C power supply filter, in which one end 42A of a wiring conductive foil 42 is electrically connected with one end 43A of a wiring conductive foil 43 by a wire 44 and each of the one ends 42A and 43A is grounded through an associated capacitor 45 or 46. In this embodiment the wire 44 acts as a resistance element of a filter circuit, which is a π type R-C power supply filter formed between the power source and the load similar to the embodiment shown in FIG. 1. The material of the wire 44 is not particularly limited and any wire made of an appropriate electrically conductive material such as an electrically conductive metal can be used. In the case of using the wire as a resistance element, a resistance value appropriate for constituting the filter can be realized by selecting or determining the material, the diameter, the cross-sectional area, the length and the like of the wire.

The embodiments shown in FIGS. 3 to 6 were described on the basis of a π type R-C power supply filter in which a circuit component capable of passing the necessary current from the side of the power supply to the side of the load is used as the resistive element of the filter. However, a T type or L type R-C power supply filter can also be constituted in the same manner as the embodiments shown in FIGS. 3 to 6.

What is claimed is:

1. A resistance-capacitance type power supply filter for preventing a high-frequency noise signal from entering a power supply through its output circuit, said filter comprising:

a circuit component connected in series with the output circuit to provide a resistive element for said filter; and a capacitive element connected between one terminal of said circuit component and ground;

wherein said filter is fabricated on a printed circuit board, wherein said circuit component comprises a conductive member connected in series with the output circuit to act as a resistive element for said filter, wherein said conductive member comprises a first printed conductor on one side of said circuit board, a second printed conductor on another side of said circuit board, and at least one through-hole connecting said first and second printed conductors, the resistance value of said at least one through-hole being set to a desired value by a diameter thereof selected to prevent said entry of the noise signal, and wherein said capacitive element is connected between said conductive member and ground.

2. A power supply filter as claimed in claim 1, wherein one end of said first printed conductor is grounded through a first capacitive element, and one end of said second printed conductor is grounded through a second capacitive element.

3. A power supply filter as claimed in claim 1, wherein said circuit component comprises a current control circuit of a semiconductor device connected in series with the output circuit, wherein said current control circuit includes said conductive member which acts as the resistance element for said filter when said semiconductor device is turned on, and wherein said capacitive element is connected between one end of said current control circuit and ground.

4. A power supply filter as claimed in claim 1, wherein said power supply filter is a π type filter having a capacitance-resistance-capacitance connection.

5. A power supply filter as claimed in claim 1, wherein said power supply filter is a T type filter having a resistance-capacitance-resistance connection.

6. A power supply filter as claimed in claim 1, wherein said power supply filter is an L type filter having a resistance-capacitance connection.

7. A power supply filter as claimed in claim 1, wherein said conductive member comprises a plurality of through-holes and the resistance value of said conductive member is set at a desired value by the number of through-holes selected.

8. A resistance-capacitance type power supply filter, said filter comprising:

a circuit component connected in series between an output circuit of a power supply and a brushless motor driving circuit, said circuit component providing a resistive element for said filter; and a capacitive element connected between one terminal of said circuit component and ground;

wherein said filter is fabricated on a printed circuit board, wherein said circuit component comprises a conductive member connected in series with the output circuit to act as a resistive element for said filter, wherein said conductive member is carried on said printed circuit board, wherein said capacitive element is connected between said conductive member and ground, and wherein the resistance value of said conductive member is set in the range of about 2 to about 5 milli-ohms at least in part by a dimensional parameter of said conductive member selected to prevent a high frequency noise signal from entering said power supply through the output circuit.

9. A power supply filter as claimed in claim 8, wherein said conductive member is a part of a printed conductor and one end of said part of the printed conductor is grounded through said capacitive element.

10. A power supply filter as claimed in claim 8, wherein said conductive member comprises a wiring conductive foil and the resistance value of said wiring conductive foil is set at a desired value by a cross-sectional area or a length thereof or both said area and said length selected to prevent said entry of the noise signal.

11. A power supply filter as claimed in claim 8, wherein said high-frequency noise signal is generated in the brushless motor driving circuit, said brushless motor driving circuit being connected with said power supply through a current control semiconductor device having a current control circuit for protecting said brushless motor driving circuit from a reverse current caused by connection of the power supply in a wrong polarity, said current control circuit of said semiconductor device being connected in series with the output circuit of said power supply and including said conductive member which acts as the resistance element for said filter when said current control circuit of said semiconductor device in a turned-on state, and said capacitive element being connected between one end of said current control circuit and ground.

12. A power supply filter as claimed in claim 8, wherein said conductive member is printed on said circuit board and comprises at least one through-hole, the resistance value of said at least one through-hole being set to a desired value by a diameter thereof selected to prevent said entry of the noise signal.

13. A power supply filter as claimed in claim 12, wherein said conductive member comprises a plurality of through-holes and the resistance value of said conductive member is set at a desired value by the number of through-holes selected.

14. A power supply filter as claimed in claim 8, wherein said circuit component comprises a current control circuit of a semiconductor device connected in series with the output circuit, said current control circuit including said conductive member which acts as the resistance element for said filter when said semiconductor device is turned on; and wherein said capacitive element is connected between one end of said current control circuit and ground.

15. A power supply filter as claimed in claim 8, wherein said power supply filter is a π type filter having a capacitance-resistance-capacitance connection.

16. A power supply filter as claimed in claim 8, wherein said power supply filter is a T type filter having a resistance-capacitance-resistance connection.

17. A power supply filter as claimed in claim 8, wherein said power supply filter is an L type filter having a resistance-capacitance connection.

18. A power supply filter as claimed in claim 8, wherein said conductive member is a wire mounted on said printed circuit board, and wherein said capacitive element is connected between one end of said wire and ground.

19. A power supply filter as claimed in claim 18, wherein the resistance value of said wire is set at a desired value by a cross-sectional area or a length thereof or both said area and said length selected to prevent said entry of the noise signal.

20. A power supply filter as claimed in claim 8, wherein said conductive member comprises a first printed conductor on one side of said circuit board, a second printed conductor on another side of said circuit board, and at least one through-hole connecting said first and second printed conductors, the resistance value of said at least one through-hole being set to a desired value by a diameter thereof selected to prevent said entry of the noise signal.

* * * * *